United States Patent [19]

Fujii

[11] Patent Number: 5,781,056
[45] Date of Patent: Jul. 14, 1998

[54] VARIABLE DELAY CIRCUIT

[75] Inventor: Haruhiko Fujii, Tokyo, Japan

[73] Assignee: Ando Electric Co., Ltd., Tokyo, Japan

[21] Appl. No.: 721,058

[22] Filed: Sep. 26, 1996

[30]     Foreign Application Priority Data

Sep. 27, 1995  [JP]  Japan ................... 7-273420

[51] Int. Cl.$^6$ ...................................... H03K 5/13
[52] U.S. Cl. .................. 327/276; 327/284; 327/261;
                                                    327/233
[58] Field of Search .................... 327/261, 284,
                    327/285, 288, 276–278, 270, 231–236,
                                237, 243–245, 250–251

[56]              References Cited

U.S. PATENT DOCUMENTS

| 4,494,021 | 1/1985  | Bell et al.       | 327/284 |
| 4,703,251 | 10/1987 | Baumgartner et al.| 327/288 |
| 5,039,893 | 8/1991  | Tomisawa          | 327/276 |
| 5,146,121 | 9/1992  | Searles et al.    | 327/276 |
| 5,216,302 | 6/1993  | Tanizawa          | 327/277 |
| 5,295,174 | 3/1994  | Shimizu           | 327/261 |
| 5,412,697 | 5/1995  | Van Brunt et al.  | 327/284 |
| 5,428,309 | 6/1995  | Yamauchi et al.   | 327/277 |
| 5,550,514 | 8/1996  | Liedberg          | 327/276 |
| 5,614,855 | 3/1997  | Lee et al.        | 327/276 |

FOREIGN PATENT DOCUMENTS 62-123821  6/1987  Japan .................. 327/278

*Primary Examiner*—Terry Cunningham
*Assistant Examiner*—Eunja Shin
*Attorney, Agent, or Firm*—Finnegan, Henderson, Farabow, Garrett & Dunner, L.L.P.

[57]              ABSTRACT

An object of the invention is to provide a variable delay circuit having a desired optional resolution.

A variable delay section 24 is provided with paths A and B which carry signals input to an input terminal 21 to an output terminal 22, and a selection section for switching the paths A and B in accordance with a select signal. Ring oscillators 25 and 29 have oscillation periods which are x times and y times the delay time of the respective paths A and B. Phase comparison circuits 27 and 31 respectively compare, the phase of a first clock signal and the output from the ring oscillator 25, and the phase of a second clock signal and the output from the ring oscillator 29. Delay time control circuits 28 and 32 then respectively control the oscillation periods of the ring oscillators 25 and 29 so as to be equal to the respective periods of the first clock signal and the second clock signal, based on the phase comparison results, and control the delay times of the paths A and B.

6 Claims, 8 Drawing Sheets ns
1

VARIABLE DELAY CIRCUIT

BACKGROUND OF THE INVENTION

1. Field of the Invention

The present invention relates to a variable delay circuit used for example for phase adjustment in a logic circuit.

2. Description of the Related Art

Conventional variable delay circuits are typically constructed as shown in FIG. 8 and FIG. 9. In FIG. 8 and FIG. 9, numeral 11 indicates a transmission signal input terminal, 12 a transmission signal output terminal, 13 and 14 delay circuits, 15 a select signal input terminal, and 16 a selector.

In FIG. 8, a transmission signal input to the input terminal 11 is supplied directly to one input terminal of the selector 16, and is also supplied indirectly to another input terminal of the selector 16 via the delay circuit 13.

The selector 16 selects one of; the signal from the input terminal 11 and the signal from the delay circuit 13, in accordance with a select signal from the select signal input terminal 15, and outputs this to the signal output terminal 12.

In FIG. 9, a transmission signal input to the input terminal 11 is supplied to one of the input terminals of the selector 16 via the delay circuit 13, and to the other of the input terminals of the selector 16 via the delay circuit 14 which has a delay time different to that of the delay circuit 13.

The selector 16 selects one of; the signal delayed by the delay circuit 13 and the signal delayed by the delay circuit 14, in accordance with a select signal from the select signal input terminal 15, and outputs this to the output terminal 12.

With the variable delay circuit of FIG. 8, the delay time of the delay circuit 13 becomes the delay time resolution of the main circuit. With the variable delay circuit of FIG. 9, the delay time resolution becomes a specific value depending upon the difference between the delay time of the delay circuit 13 and the delay time of the delay circuit 14. However with both circuit configurations, the delay time resolution is limited to a specific value, and hence from a versatility point of view efficiency is poor.

With the conventional variable delay circuit described above, there is thus the problem that the delay time resolution is limited to specific values.

SUMMARY OF THE INVENTION

It is an object of the present invention solve the above problem, by providing a variable delay circuit which can have a desired optional resolution.

Accordingly, the present invention comprises: a variable delay device for outputting from an output terminal thereof, a signal input to an input terminal thereof and passing via one of a first path and a second path having variable delay times; a variable oscillation period first oscillating device having an oscillation period of x (where x is an optional positive integer) times the delay time of the first path; a first phase comparison device for comparing the phases of a first clock signal and an output signal from the first oscillating device; a first delay time control device for making the oscillation period of the first oscillating device equal to the period of the first clock signal, based on the comparison results of the first phase comparison device, and for controlling the delay time of the first path; a variable oscillation period second oscillating device having an oscillation period of y (where y is an optional positive integer) times the delay time of the second path; a second phase comparison device for comparing the phases of a second clock signal and an output signal from the second oscillating device; and a second delay time control device for making the oscillation period of the second oscillating device equal to the period of the second clock signal, based on the comparison results of the second phase comparison device, and for controlling the delay time of the second path.

With the present invention as described above, it is possible to provide a variable delay circuit which can give a desired optional resolution.

DESCRIPTION OF THE PREFERRED EMBODIMENTS

As follows is a detailed description of embodiments of the present invention, with reference to FIG. 1 through FIG. 7.

Figure 1:
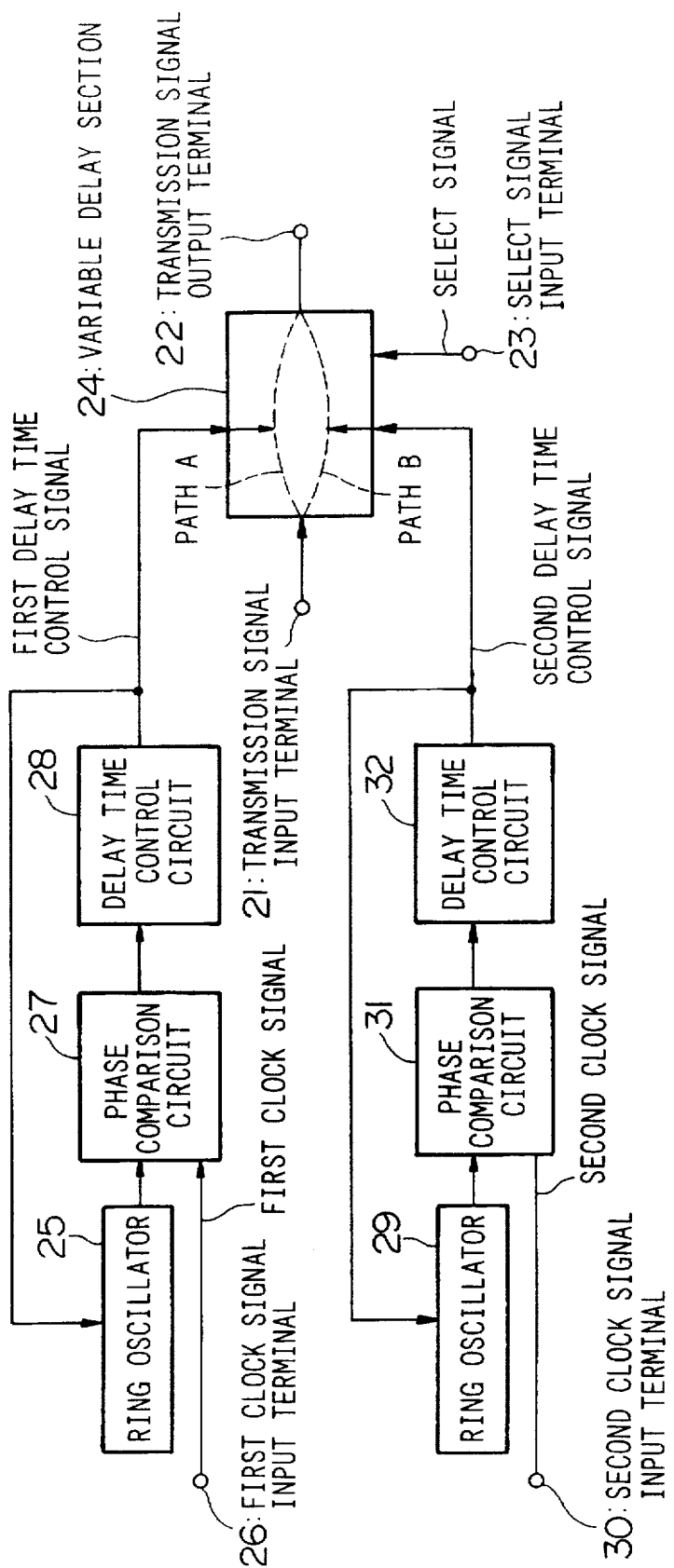
FIG. 1 is a block circuit diagram showing a basic configuration of a first embodiment of a variable delay circuit according to the present invention.

FIG. 1 is a block circuit diagram showing a basic configuration of a variable delay circuit according to the present invention. In FIG. 1, numeral 21 indicates a transmission signal input terminal, 22 a transmission signal output terminal, and 23 a select signal input terminal.

A signal input to the transmission signal input terminal 21 is supplied to a variable delay section 24. The variable delay section 24 is provided with; first and second paths A and B, which apply respective optional delay times to the input signal during transmission to the output terminal 22, and a selection function (not shown in the figure) for selecting one of the first delay path A and the second delay path B, in accordance with a select signal supplied from the select signal input terminal 23. Here with the first delay path A the delay time is changed in accordance with a first delay time control signal, while with the second delay path B the delay time is changed in accordance with a second delay time control signal.

A first ring oscillator 25 oscillates with an oscillation period x times the delay time of the first delay path A, the oscillation period being optionally changed by the first delay time control signal. Furthermore, a second ring oscillator 29 oscillates with an oscillation period y times the delay time of the second delay path B, the oscillation period being optionally changed by the second delay time control signal.

A phase comparison circuit 27 compares the phases of an output from the first ring oscillator 25 and a first clock signal, and supplies the comparison result to a delay time control circuit 28. The delay time control circuit 28 then generates a first delay time control signal corresponding to the phase comparison results obtained by the phase comparison circuit 27, to thereby make the oscillation period of the first ring oscillator 25 equal to a period T1 of the first clock signal, and supplies the first delay time control signal to the first path A, to thereby variably control the delay time.

A phase comparison circuit 31 compares the phases of an output from the second ring oscillator 29 and a second clock signal, and supplies the comparison result to a delay time control circuit 32. The delay time control circuit 32 then generates a second delay time control signal corresponding to the phase comparison results obtained by the phase comparison circuit 31, to thereby make the oscillation period of the second ring oscillator 29 equal to a period T2 of the second clock signal, and supplies the second delay time control signal to the second path B, to thereby variably control the delay time.

With the above configuration, the delay time of the first path A becomes T1/x, and the delay time of the second path B becomes T2/y. Consequently, by setting appropriate values for T1, T2, x and y, then a variable delay circuit with desired optional resolution can be obtained.

Figure 2:
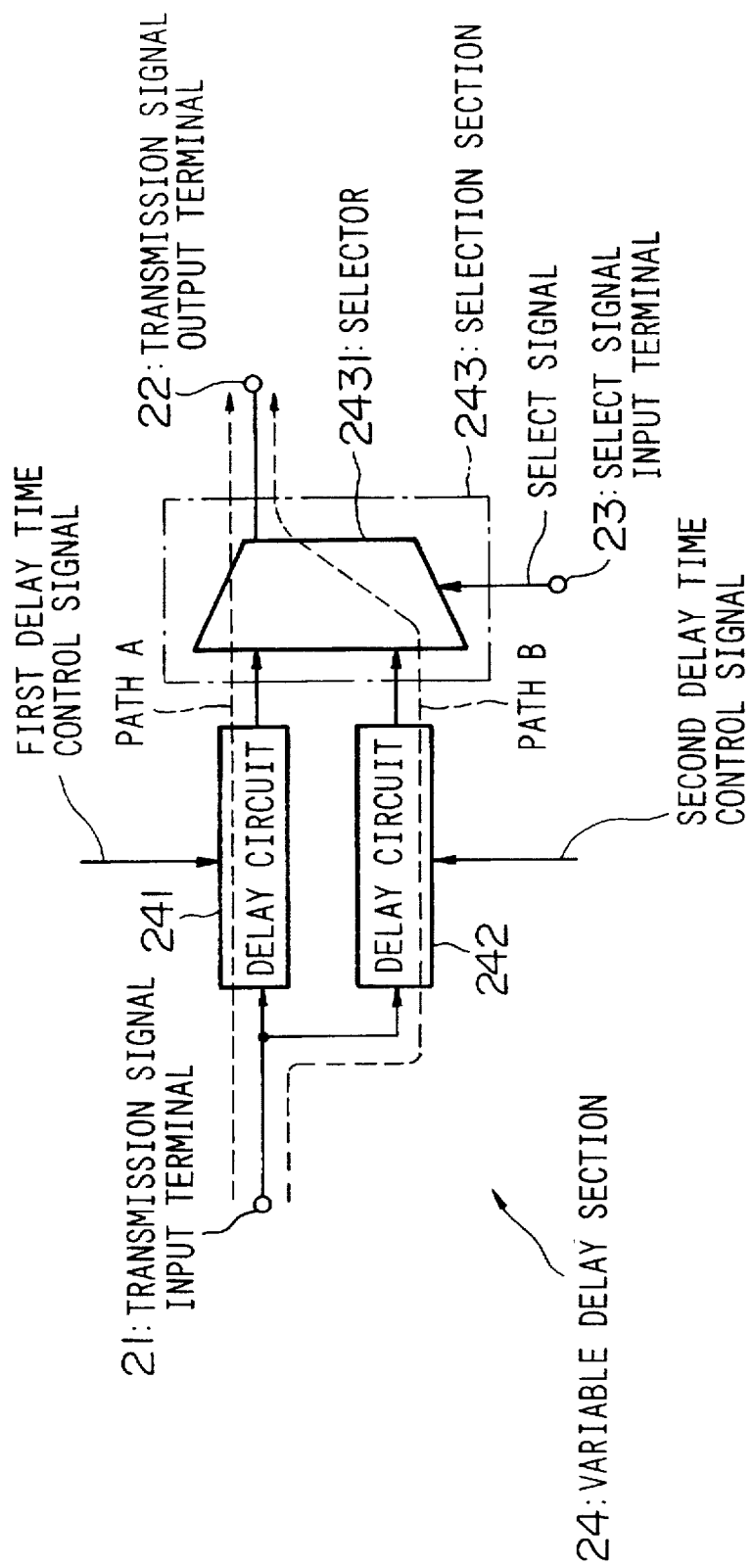
FIG. 2 is a block circuit diagram showing a basic configuration of a variable delay section of the embodiment.

FIG. 2 shows the basic configuration of the variable delay section 24. With the variable delay section 24, a delay circuit 241 in which the delay time can be varied corresponding to the first delay time control signal, is provided in the first path A, and a delay circuit 242 in which the delay time can be varied corresponding to the second delay time control signal, is provided in the second path B. The selection of the paths A, B, is carried out by a selector 2431 constituted by a selection portion 243, in accordance with the select signal.

The delay time of the delay circuit 241 is 1/x of the oscillation period of the first ring oscillator 25, and is controlled together with the oscillation period of the first ring oscillator 25 by the first delay time control signal. Moreover, delay time of the delay circuit 242 is 1/y of the oscillation period of the second ring oscillator 29, and is controlled together with the oscillation period of the second ring oscillator 29 by the second delay time control signal.

Figure 3:
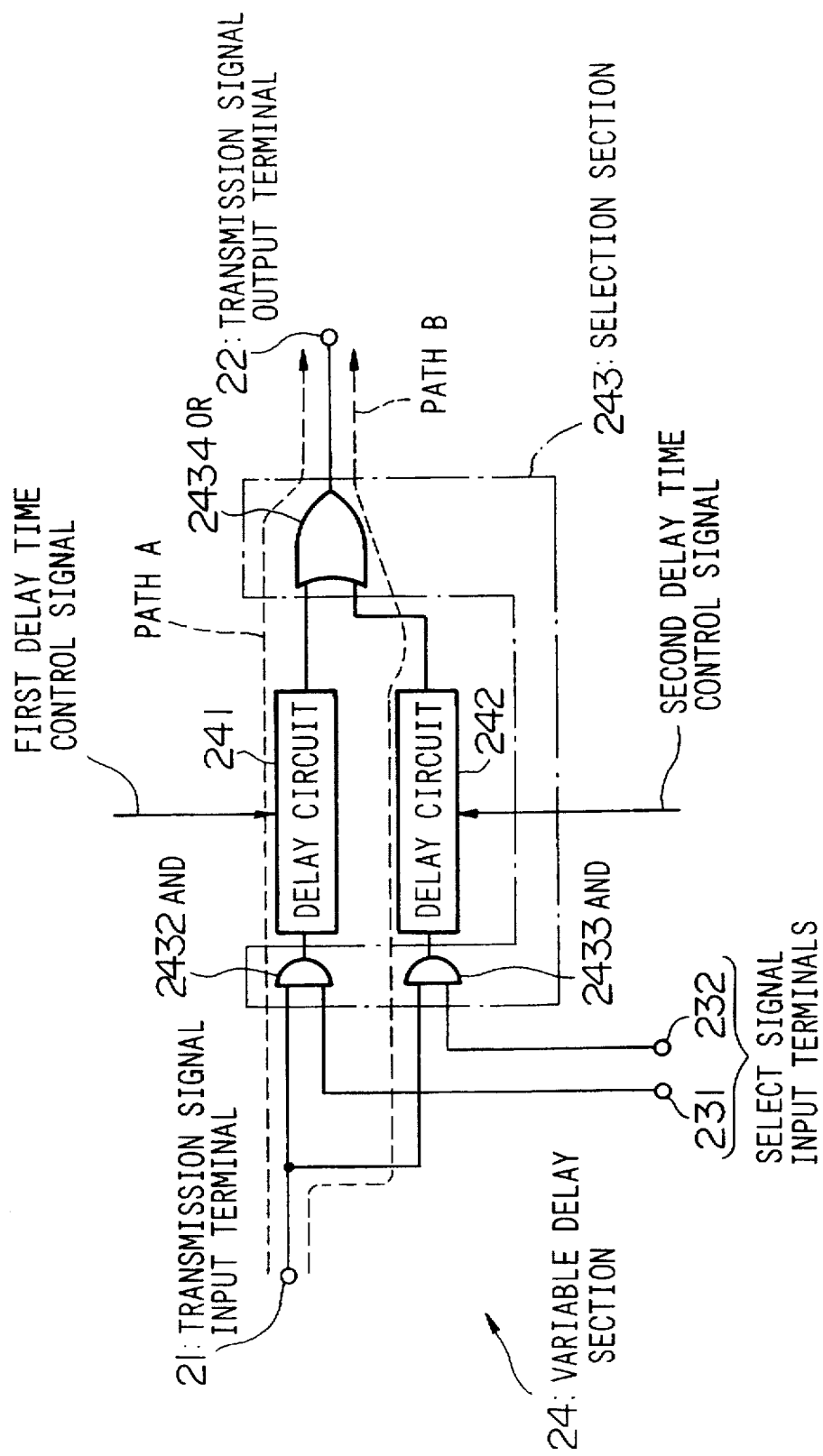
FIG. 3 is a block circuit diagram showing another basic configuration of a variable delay section of the embodiment.

FIG. 3 show another basic configuration of the variable delay section 24, with a different configuration for the selection section 243 of FIG. 2. That is to say, with the variable delay section 24, the input signal is supplied to two AND circuits 2432 and 2433, and the logical products with a two bit select signal supplied to respective terminals 231, 232 obtained. These logical products are then respectively supplied to a delay circuit 241 in the first path A and a delay circuit 242 in the second path B. The logical sum of the delay outputs from the respective delay circuits 241, 242 is then obtained with an OR gate 2434.

That is to say, the variable delay section 24, delays the logical product signal of the input signal and a first bit of the select signal in the delay section 241, and makes this one input to the OR gate 2434. Furthermore, the variable delay section 24, delays the logical product signal of the input signal and a second bit of the select signal in the delay section 242, and makes this another input to the OR gate 2434.

By making the first bit of the select signal (terminal 231 side) level H, and the second bit (terminal 232 side level L, then the input signal can be sent to the output terminal 22 via the delay circuit 241. Moreover, by making the first bit of the select signal (terminal 231 side) level L, and the second bit (terminal 232 side ) level H, then the input signal can be sent to the output terminal 22 via the delay circuit 242.

Figure 4:
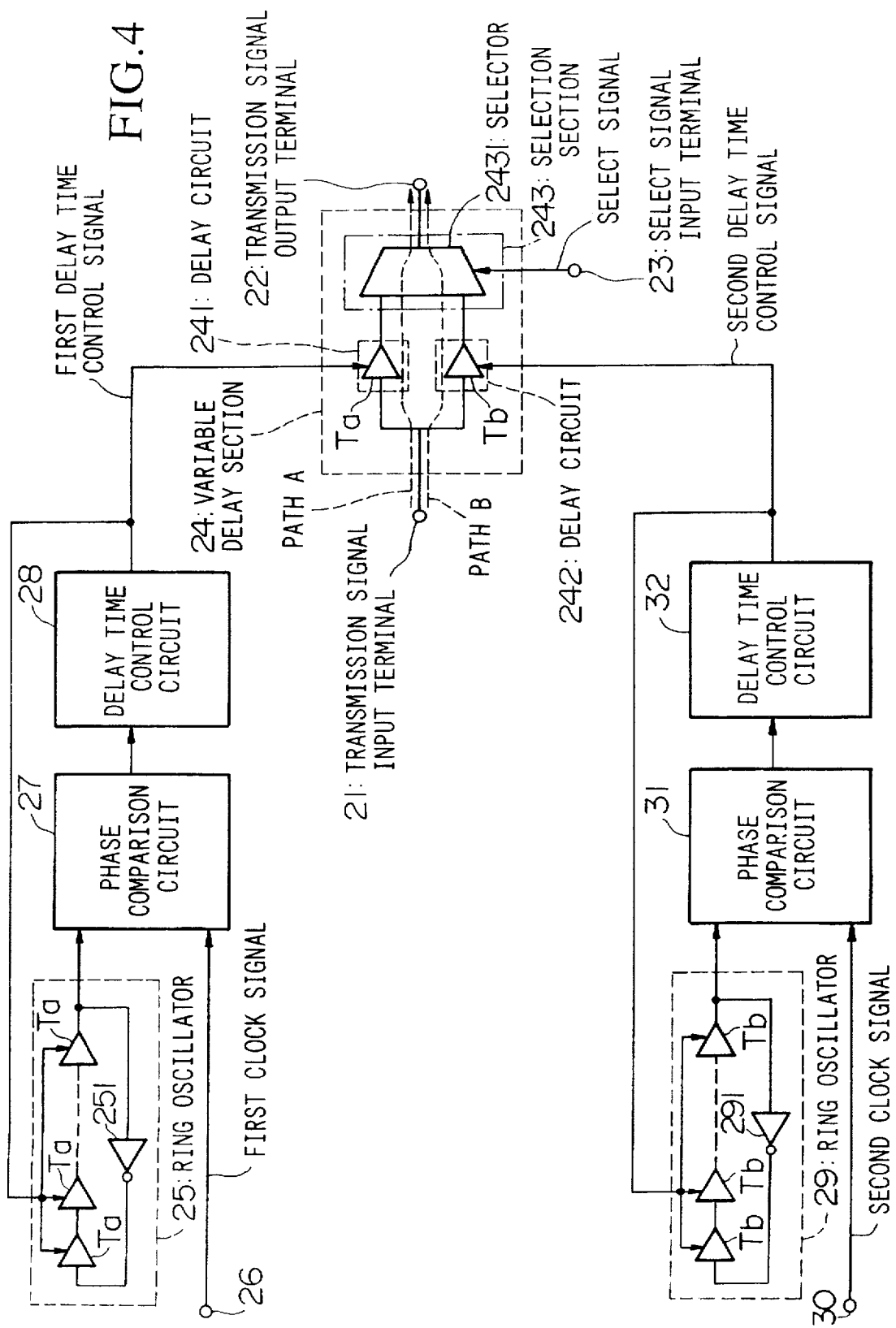
FIG. 4 is a block circuit diagram showing a basic configuration of first and second ring oscillators for when the configuration of the variable delay section shown in FIG. 2 is used.

FIG. 4 show an example of a basic configuration of first and second ring oscillators 25 and 29, for when the configuration of the variable delay section 24 shown in FIG. 2 is used.

The first ring oscillator 25 is constructed with x' series connected devices the same as the variable delay element Ta used in the delay circuit 241 of the first path A, with the output therefrom inverted by an inverter 251 and fedback to the input side, and hence oscillates with a period of 2x' times the delay time of the variable delay element Ta. Here the first delay time control signal output from the delay time control circuit 28 is applied to the each of the variable delay elements Ta.

Moreover, the second ring oscillator 29 is constructed with y' series connected devices the same as the variable delay element Tb used in the delay circuit 242 of the second path B, with the output therefrom inverted by an inverter 291 and fedback to the input side, and hence oscillates with a period of 2Y' times the delay time of the variable delay element Tb. Here the second delay time control signal output from the delay time control circuit 32 is applied to each of the variable delay elements Tb.

In this way, the delay time of the first path A can be made T1/2x', while making the oscillation period of the first ring oscillator 25 equal to the period T1 of the first clock signal.

Moreover, the delay time of the second path B can be made T2/2y', while making the oscillation period of the second ring oscillator 29 equal to the period T2 of the second clock signal.

For example, if the number of stages of the variable delay elements Ta in the first ring oscillator 25 is made x' =9 stages, and the number of stages of the variable delay element Tb in the second ring oscillator 29 is made y'=10 stages, and the period T1 of the first clock signal and the period T2 of the second clock signal are both made 180 ns, then the delay time per variable delay element Ta becomes 10 ns, while the delay time per variable delay element Tb becomes 9 ns.

Consequently, with the variable delay section 24, for a delay time for the delay circuit 241 of the first path A of 10 ns, the delay time for the delay circuit 242 of the second path B becomes 9 ns. Hence, the resolution of the variable delay circuit in this case becomes 1 ns.

Figure 5:
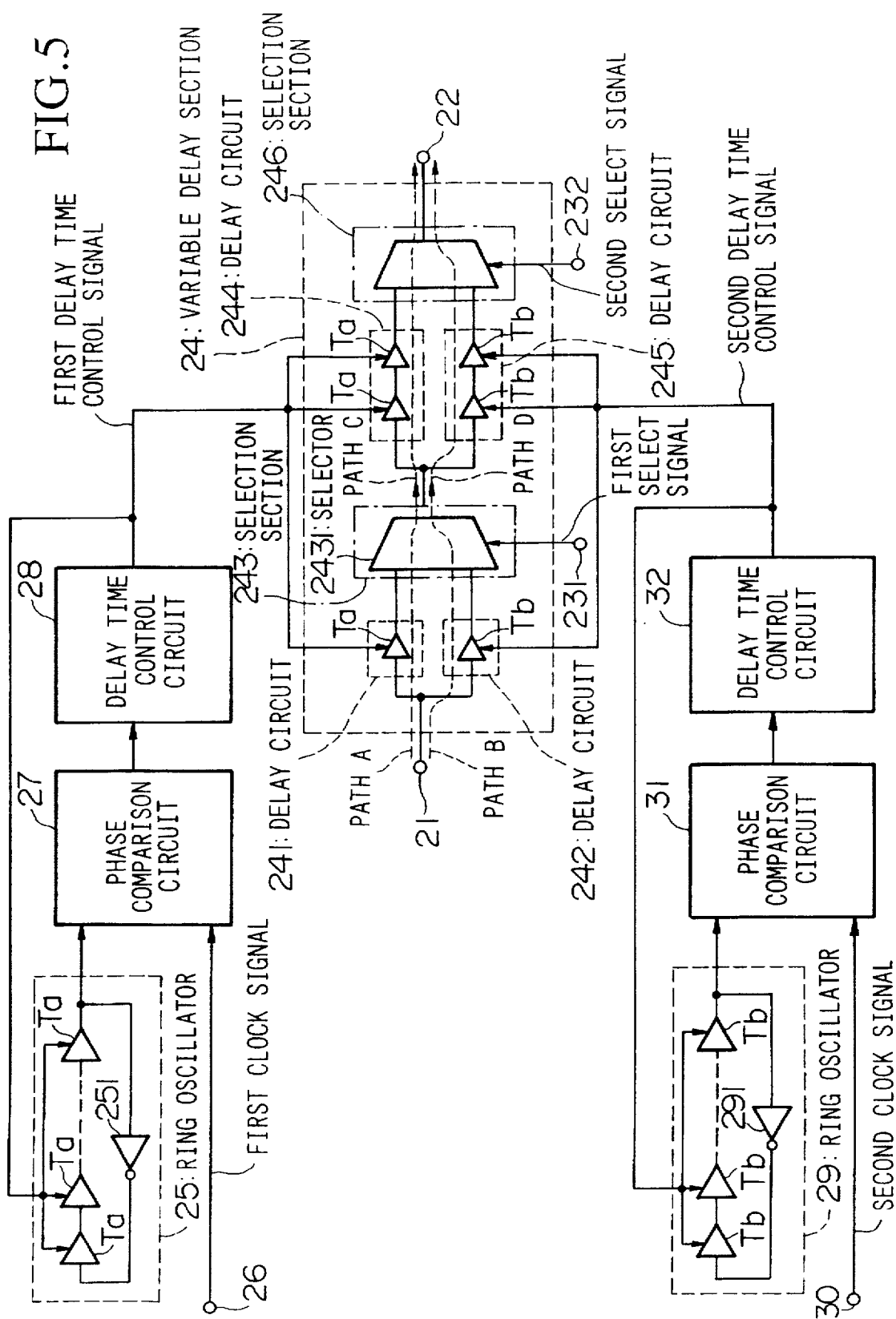
FIG. 5 is a block circuit diagram showing a case where the embodiment illustrated in FIG. 4 is expanded to give a multistage configuration for the variable delay section.

FIG. 5 shows an arrangement wherein the embodiment of FIG. 4 is expanded to give a multistage configuration for the variable delay section 24 (two stages in this case). Of these two stages, the initial stage comprises the delay circuits 241 and 242, and the selection section 243, while the next stage comprises the delay circuits 244 and 245, and the selection section 246.

The initial stage circuit selects the first or second path A or B, based on a first select signal supplied from a terminal 231. The next stage circuit then selects a third or fourth path C or D, based on a second select signal supplied from a terminal 232.

The delay circuit 244 provided in the third path C, comprises two series connected devices the same as the variable delay element Ta used in the delay circuit 241 of the first path A, with the delay times of the respective variable delay elements Ta controlled together by the first delay time control signal. Moreover, the delay circuit 245 provided in the fourth delay path D, comprises two series connected devices the same as the variable delay element Tb used in the delay circuit 242 of the second path B, with the delay times of the respective variable delay elements Tb controlled together by the second delay time control signal.

The operation of this circuit was described in the beforementioned example. If the number of stages of the variable delay elements Ta in the first ring oscillator 25 is made x'=9 stages, and the number of stages of the variable delay elements Tb in the second ring oscillator 29 is made y'=10 stages, and the period T1 of the first clock signal and the period T2 of the second clock signal are both made 180 ns, then the delay time per variable delay element Ta becomes 10 ns, while the delay time per variable delay element Tb becomes 9 ns.

Consequently, with the variable delay section 24, for a delay time for the delay circuit 241 of the first path A of 10 ns, the delay time for the delay circuit 242 of the second path B becomes 9 ns. Moreover, for a delay time for the delay circuit 244 of the third path C of 20 ns, the delay time for the delay circuit 245 of the fourth path D becomes 18 ns. Hence, the resolution of the variable delay circuit in this case 1 ns for the former stage of the variable delay section 24, and 2 ns for the latter stage, this enabling a greater variable range for the delay time than for the case of FIG. 4.

Figure 6:
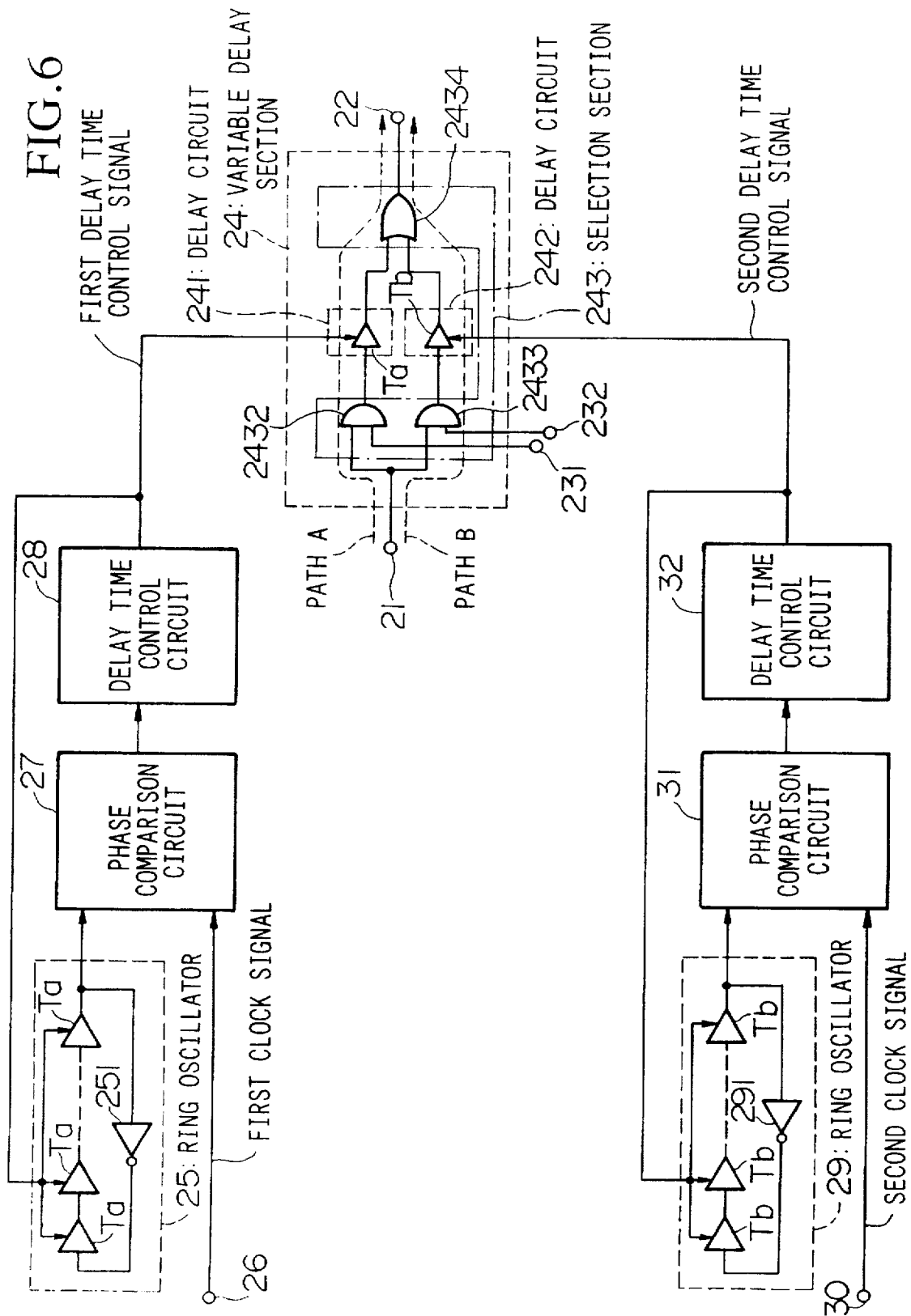
FIG. 6 is a block circuit diagram showing a basic configuration of first and second ring oscillators for when the configuration of the variable delay section shown in FIG. 3 is used.

FIG. 6 shows the basic configuration of first and second ring oscillators 25 and 29, for when the configuration of the variable delay section 24 shown in FIG. 3 is used. In this case, as is clear from FIG. 6, the first and second ring oscillators 25 and 29 can be realized with a configuration exactly the same as that shown in FIG. 4.

That it to say, the first ring oscillator 25 is constructed with x' series connected devices the same as the variable delay element Ta used in the delay circuit 241 of the first path A, with the output therefrom inverted by an inverter 251 and fedback to the input side, and hence oscillates at a period of 2x' times the delay time of the variable delay element Ta. Here the first delay time control signal output from the delay time control circuit 28 is applied to each of the variable delay elements Ta.

Moreover, the second ring oscillator 29 is constructed with y' series connected devices the same as the variable delay element Tb used in the delay circuit 242 of the second path B, with the output therefrom inverted by an inverter 291 and fedback to the input side, and hence oscillates with a period of 2Y' times the delay time of the variable delay element Tb. Here the second delay time control signal output from the delay time control circuit 32 is applied to each of the variable delay elements Tb.

In this way, the delay time of the first path A can be made T1/2x', while making the oscillation period of the first ring oscillator 25 equal to the period T1 of the first clock signal. Moreover, the delay time of the second path B can be made T2/2y', while making the oscillation period of the second ring oscillator 29 equal to the period T2 of the second clock signal.

Figure 7:
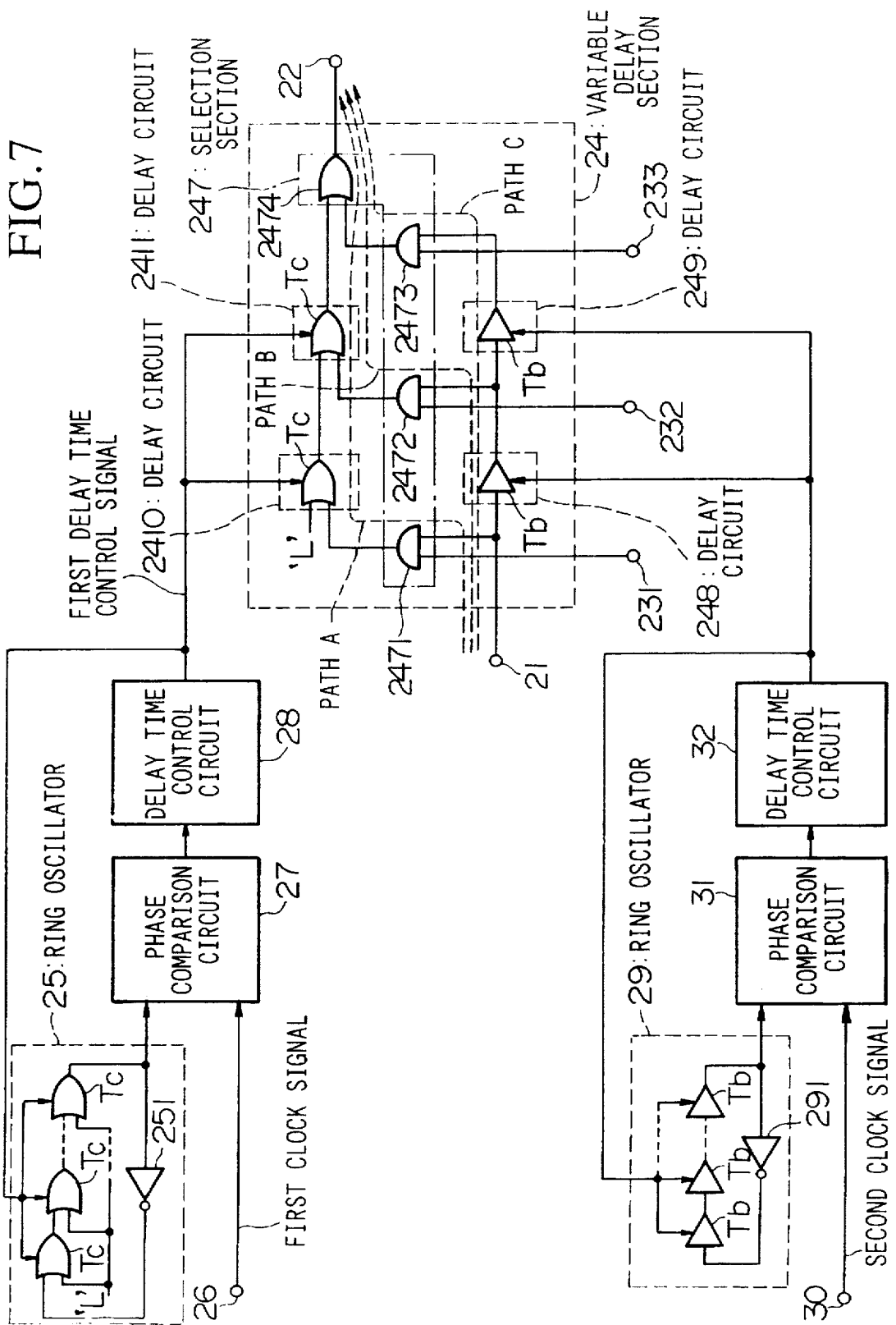
FIG. 7 is a block circuit diagram showing a case where the configuration of FIG. 6 is further expanded using OR gates having delay time adjustment functions.
Figure 8:
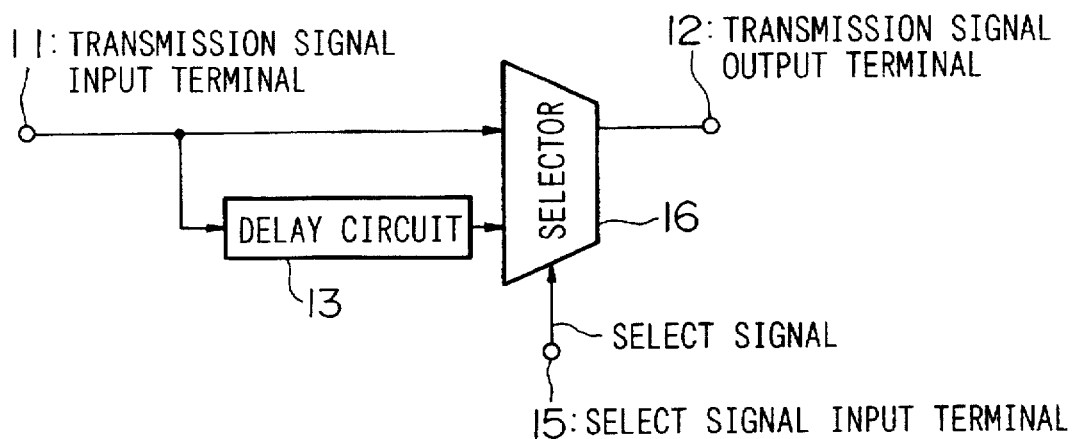
FIG. 8 is a block circuit diagram showing a configuration of a conventional variable delay circuit.
Figure 9:
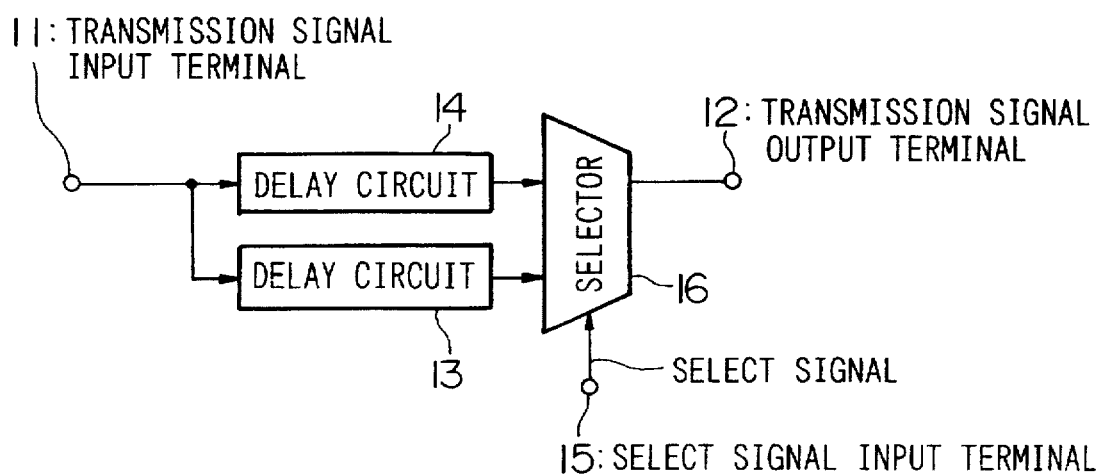
FIG. 9 is a block circuit diagram showing another configuration of a conventional variable delay circuit.

For the variable delay elements, controllable delay time OR gates can be used. FIG. 7 shows a configuration for when the configuration of FIG. 6 is further expanded, using such OR gates having an adjustable delay time function.

With the variable delay section 24 shown in FIG. 7, the transmission signal from the transmission signal input terminal 21, is supplied to an AND gate 2471, and is also supplied to an AND gate 2472 via a delay circuit 248, and to an AND gate 2473 via a delay circuit 249. The AND gates 2471–2473 are respectively selected with select signals supplied from corresponding select terminals 231–233, to thereby become active.

The output from the AND gate 2471 is supplied to a delay circuit 2410, the output from the AND gate 2472 is supplied to a delay circuit 2411, while the output from the AND gate 2473 is supplied to an OR gate 2474. The output from the delay circuit 2410 is supplied to the delay circuit 2411, and the output from the delay circuit 2411 is supplied to the OR gate 2474.

The delay circuits 2410 and 2411 are each made up using one identical variable delay time OR gate Tc (with the delay circuit 2410, one terminal is fixed at level L), with the delay time respectively controlled by the first delay time control signal. Moreover, the first ring oscillator 25 is constructed with x' series connected variable delay time OR gates Tc the same as these (with one terminal fixed at level L), with the output therefrom inverted by an inverter 251 and fedback to the input side, and hence oscillates at a period of 2x' times the delay time of the variable delay time OR gate Tc. With each of the variable delay time OR gates Tc, the delay times are respectively controlled by the first delay time control signal.

On the other hand, the delay circuits 248 and 249 are each made up using one identical variable delay element Tb, with the delay times respectively controlled by the second delay time control signal. Moreover, the second ring oscillator 29 is constructed with y' series connected variable delay elements Tb Tc the same as these, with the output therefrom inverted by an inverter 291 and fedback to the input side, and hence oscillates at a period of 2y' times the delay time of the variable delay element Tb. With each of the variable delay elements Tb, the delay times are respectively controlled by the second delay time control signal.

Here the AND gates 2471–2473, and the OR gate 2474 make up the selection section 247. When a select signal is input to the terminal 231, then the first path A (the path which takes the input transmission signal via the AND gate 2471 and the delay circuits 2410 and 2411, to the output terminal 22 from the OR gate 2474) is selected.

Moreover, with the selection section 247, when a select signal is input to the terminal 232, then the second path B (the path which takes the input transmission signal via the delay circuit 248, the AND gate 2472 and the delay circuit 2411, to the output terminal 22 from the OR gate 2474) is selected.

Furthermore, with the selection section 247, when a select signal is input to the terminal 233, then the third path C (the path which takes the input transmission signal via the delay circuits 248 and 249, the AND gate 2473, to the output terminal 22 from the OR gate 2474) is selected.

With the various configurations as described above, then an optional resolution can be obtained by appropriately setting the number of delay elements in the first and second ring oscillators 25 and 29. Moreover, optional paths can be selected depending on the method of inputting the select signal.

What is claimed is:

1. A variable delay circuit comprising:
   variable delay means for outputting, from an output terminal thereof, an input signal inputted to an input terminal thereof and passing via one of a first path and a second path having variable delay times;
   variable oscillation period first oscillating means having an oscillation period of x (where x is an optional positive integer) times the delay time of said first path;

first phase comparison means for comparing the phases of a first clock signal and an output signal from said first oscillating means;

first delay time control means for making the oscillation period of said first oscillating means equal to the period of said first clock signal, based on the comparison results of said first phase comparison means, and for controlling the delay time of said first path;

variable oscillation period second oscillating means having an oscillation period of y (where y is an optional positive integer) times the delay time of said second path;

second phase comparison means for comparing the phases of a second clock signal and an output signal from said second oscillating means; and second delay time control means for making the oscillation period of said second oscillating means equal to the period of said second clock signal, based on the comparison results of said second phase comparison means, and for controlling the delay time of said second path. results of said second phase comparison means, and for controlling the delay time of said second path.

2. A variable delay circuit according to claim 1, wherein said first path has n variable delay elements (where n is a natural number), and said second path has m variable delay elements (where m is a natural number), said first oscillating means is a ring oscillator comprising a first delay path of x' series connected variable delay elements (where x' is a natural number), with the output therefrom inverted and fedback, said first delay time control means simultaneously controls the delay times of, the variable delay elements of said first path, and each of the variable delay elements of said first oscillation means, said second oscillating means is a ring oscillator comprising a second delay path of y' series connected variable delay elements (where y' is a natural number, such that when the period of the first clock signal is T1, and the period of the second clock signal is T2, then T1*x'/n is not equal to T2*y'/m), with the output therefrom inverted and fedback, and said second delay time control means simultaneously controls the delay times of, the variable delay elements of said second path, and each of the variable delay elements of said second oscillation means.

3. A variable delay circuit according to claim 1, comprising:

first delay means provided in said first path;

second delay means provided in said second path; and selection means for selecting one of, a delay output from said first delay means and a delay output from said second delay means, in accordance with a select signal, and outputting the selected value from said output terminal.

4. A variable delay circuit according to claim 1, wherein said variable delay means comprises:

a first AND gate for inputting said input signal to said first path in accordance with a first select signal;

a second AND gate for inputting said input signal to said second path in accordance with a second select signal;

first delay means for variably delaying an output from said AND gate;

second delay means for variably delaying an output from said second AND gate; and an OR gate for carrying out a logical sum operation on the output from said first delay means and the output from said second delay means, and outputting the resultant logical sum from said output terminal.

5. A variable delay circuit according to claim 3, wherein said variable delay means comprises a plurality of series connected stages of delay circuits comprising said first path, said second path, said first delay means said second delay means and said selection means, with the delay times of the first paths of the respective stages controlled by said first delay time control means, and the delay times of the second paths of the respective stages controlled by said second delay time control means.

6. A variable delay circuit comprising:

variable delay means for outputting, from an output terminal, a variable delay signal passing via one of a first path having n variable delay elements (where n is a natural number) and a second path having m variable delay elements (where m is a natural number);

variable oscillation period first oscillating means having an output of a first delay path of x' series connected variable delay elements (where x' is a natural number) inverted and fed back and having an oscillation period of x (where x is an optional positive integer) times the delay time of said first path;

first phase comparison means for comparing the phase of a first clock signal and an output signal from said first oscillating means;

first delay time control means for making the oscillation period of said first oscillating means equal to the period of said first clock signal, based on the comparison results of said first phase comparison means, and for simultaneously controlling the delay times of the variable delay elements of said first path and said first oscillating means;

variable oscillation period second oscillating means having an output of a second delay path of y' series connected variable delay elements (where y' is a natural number) inverted and fed back and having an oscillation period of y (where y is a natural number such that when the period of the first clock signal is T1 and the period of the second clock signal is T2, then T1*x'/n is not equal to T2*y'/m');

second phase comparison means for comparing the phases of a second clock signal and an output signal from said second oscillating means; and second delay time control means for making the oscillation period of said second oscillating means equal to the period of said second clock signal, based on the comparison results of said second phase comparison means, and for simultaneously controlling the delay times of the variable delay elements of said second path and said second oscillating means.

* * * * *

UNITED STATES PATENT AND TRADEMARK OFFICE
CERTIFICATE OF CORRECTION

PATENT NO. : 5,781,056
DATED : July 14, 1998
INVENTOR(S) : Haruhiko Fujii

It is certified that error appears in the above-indentified patent and that said Letters Patent is hereby corrected as shown below:

Claim 1, Column 7, lines 21-22, after "path.", delete "results of said second phase comparison means, and for controlling the delay time of said second path."

Claim 5, Column 8, line 14, after "means", insert --,--.

Signed and Sealed this

Eleventh Day of May, 1999

Attest:

Q. TODD DICKINSON

*Attesting Officer*     *Acting Commissioner of Patents and Trademarks*